United States Patent
Chen et al.

(10) Patent No.: US 7,724,839 B2
(45) Date of Patent: May 25, 2010

(54) MULTILEVEL LINC TRANSMITTER

(75) Inventors: Yuan-Jyue Chen, Taipei (TW); Kai-Yuan Jheng, Taoyuan County (TW); An-Yeu Wu, Taipei (TW); Hen-Wai Tsao, Taipei (TW); Posen Tseng, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 510 days.

(21) Appl. No.: 11/757,479

(22) Filed: Jun. 4, 2007

(65) Prior Publication Data

US 2008/0019459 A1 Jan. 24, 2008

Related U.S. Application Data

(60) Provisional application No. 60/807,952, filed on Jul. 21, 2006.

(51) Int. Cl.
*H04L 25/49* (2006.01)
*H04B 1/04* (2006.01)
(52) U.S. Cl. .................... 375/296; 455/114.3
(58) Field of Classification Search .............. 375/285, 375/295–297; 455/63.1, 114.2, 114.3, 127.2
See application file for complete search history.

(56) References Cited

U.S. PATENT DOCUMENTS 3,927,379 A 12/1975 Cox et al.
6,313,703 B1 * 11/2001 Wright et al. .......... 330/149
6,633,200 B2 10/2003 Kolanek
6,825,719 B1 11/2004 Barak et al.
7,280,612 B2 1/2005 Saed
7,260,157 B2 8/2007 Hagh
7,336,753 B2 * 2/2008 Hasson et al. .......... 375/376
7,639,072 B2 * 12/2009 Sorrells et al. ............ 330/2
2003/0125065 A1 * 7/2003 Barak et al. ............ 455/522

FOREIGN PATENT DOCUMENTS

CN 1190286 8/1998

OTHER PUBLICATIONS

"3rd Generation Partnership Project: Technical Specification Group Radio Access Network; User Equipment (UE) Radio Transmission and Receptor (FDD)" 3GPP TS 25.101 V7.1.0 (Sep. 2005).
"3rd Generation Partnership Project: Technical Specification Group Radio Access Network; User Equipment (UE) Radio Transmission and Reception (FDD)" 3GPP TS 25.101 V7.2.0 (Dec. 2005).

(Continued)

*Primary Examiner*—Khanh C Tran
(74) *Attorney, Agent, or Firm*—Thomas, Kayden, Horstemeyer & Risley

(57) ABSTRACT

A multilevel LINC transmitter. The multilevel LINC transmitter comprises a multilevel signal component separator, a phase modulator block, and an RF block. The multilevel signal component separator comprises a multilevel scaler and converts a base band signal to constant envelope signals. The phase modulator block is coupled to the multilevel signal component separator. The RF block comprises a plurality of power amplifiers coupled to the phase modulator block and the multilevel scaler and a power combiner coupled to the power amplifiers.

10 Claims, 10 Drawing Sheets

OTHER PUBLICATIONS

"Wireless Multi-Standard Terminals: System Analysis and Design of a Reconfigurable RD Front-end" Federico Agnelli, et al.; 2006; pp. 38-59.

"Phase-Only Predistortion for LINC Amplifiers with Chireix-Outphasing Combiners" Ahmed Birafane, et al.; Jun. 2005; pp. 2240-2250.

"On the Linearity and Efficiency of Outphasing Microwave Amplifiers" Ahmed Birafane, et al.; Jul. 2004; pp. 1702-1708.

"Linear Amplification with Nonlinear Components" D.C. Cox; Dec. 1974; pp. 1942-1945.

"EER Architecture Specifications for OFDM Transmitter Using a Class E Amplifier" A. Diet, et al.; Aug. 2004; pp. 389-391.

"A 1.75-GHz Polar Modulated CMOS RF Power Amplifier for GSM-EDGE" Patrick Reynaert., et al.; Dec. 2005; pp. 2598-2608.

"Polar Transmitter for Wireless Communication System" Chung-Chun Chen, et al.; Dec. 2005; pp. 613-616.

"Nonlinear Distortion Cancellation Using LINC Transmitters in OFDM Systems" Paloma Garcia, et al.; Mar. 2005; pp. 84-93.

"LINC Digital Component Separator for Single and Multicarrier W-CDMA Signals" Walter Gerhard, et al.; Jan. 2005; pp. 274-282.

English abstract of CN1190286, pub. Aug. 12, 1998.

* cited by examiner

MULTILEVEL LINC TRANSMITTER

This application claims the benefit of U.S. Provisional Application No. 60/807,952, filed on Jul. 21, 2007.

BACKGROUND OF THE INVENTION

1. Field of the Invention

The invention relates to a LINC transmitter and, in particular, to a multilevel LINC transmitter.

2. Description of the Related Art

To prolong battery life of mobile handset devices, demands on power efficiency of wireless mobile communication systems have become more important. In general, the most power hungry device in a transceiver is a power amplifier which has nonlinear characteristics. In addition, modulation of non-constant-envelope signals demands high linearity of a power amplifier. As a result, a trade off between linearity and power efficiency in a wireless transmitter is necessary.

Various PA linearization techniques have been adopted to improve linearity and power efficiency of wireless transmitters. Linear amplification with nonlinear components (LINC) is a transmitter architecture which increases linearity and power efficiency of a wireless transmitter. Due to accurate signal processing and insensitivity to process variation, a digital LINC architecture is more suitable for modern process technologies.

FIG. 1 is a block diagram of a conventional LINC architecture. As shown in FIG. 1, an input signal S(t) of the LINC 100 is a varying envelope signal. A signal separator 110 receives and divides the input signal S(t) into two constant-envelope signals S1 and S2. Subsequently, two power amplifiers PA1 and PA2 respectively amplify the constant-envelope signals S1 and S2. Since a nonlinear power amplifier can amplify a constant-envelope signal linearly, two power efficient nonlinear power amplifiers are used in such architecture. Finally, the two amplified signals are combined by a power combiner 120. Thus, a linearly amplified signal is obtained at an output of the power combiner 120.

The input of the LINC system is a varying-envelope signal S(t), $$S(t) = A(t) \cdot e^{j\phi(t)}$$

wherein A(t) denotes the signal envelope and $\phi(t)$ is signal phase. In the phasor diagram shown in FIG. 2A, the varying-envelope signal S(t) is split into a set of constant-envelope signals, $S_1(t)$ and $S_2(t)$, $$S(t) = \frac{1}{2}[S_1(t) + S_2(t)]$$
$$= \frac{1}{2}r_0[e^{j(\phi(t)+\theta(t))} + e^{j(\phi(t)-\theta(t))}]$$

And an out-phasing angle $\theta(t)$ is expressed as $$\theta(t) = \cos^{-1}\left(\frac{A(t)}{r_0}\right)$$

Both $S_1(t)$ and $S_2(t)$ are on a circle with a radius $r_0$. In a conventional LINC transmitter, $r_0$ is a constant scale factor predefined by a system designer. Because input range of an inverse cosine function is [−1, 1], selection of $r_0$ needs to satisfy the formula:

$$r_0 \geq \max(A(t))$$

FIG. 2B illustrates the signals after amplification. The amplified signals are expressed as $G \cdot S_1(t)$ and $G \cdot S_2(t)$, where G is voltage gain of the power amplifiers. The two amplified signals are combined by a power combiner to obtain a signal $\sqrt{2}G \cdot S(t)$ which is a linear amplification of the input signal S(t). Because of the out-phasing technique, LINC achieves linear amplification with two power efficient nonlinear power amplifiers.

BRIEF SUMMARY OF THE INVENTION

An embodiment of a multilevel LINC transmitter comprises a multilevel signal component separator, a phase modulator block, and an RF block. The multilevel signal component separator comprises a multilevel scaler and converts an input signal to phase signals. The phase modulator block is coupled to the multilevel signal component separator. The RF block comprises a plurality of power amplifiers coupled to the phase modulator block and the multilevel scaler and a power combiner coupled to the power amplifiers.

The invention provides a multilevel LINC transmitter with a multilevel scaler in a multilevel signal component separator thereof. The multilevel scaler dynamically adapts a scale factor according to the input signal and therefore the out-phasing angle is adjustable. As a result, high power efficiency and linearity are achieved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
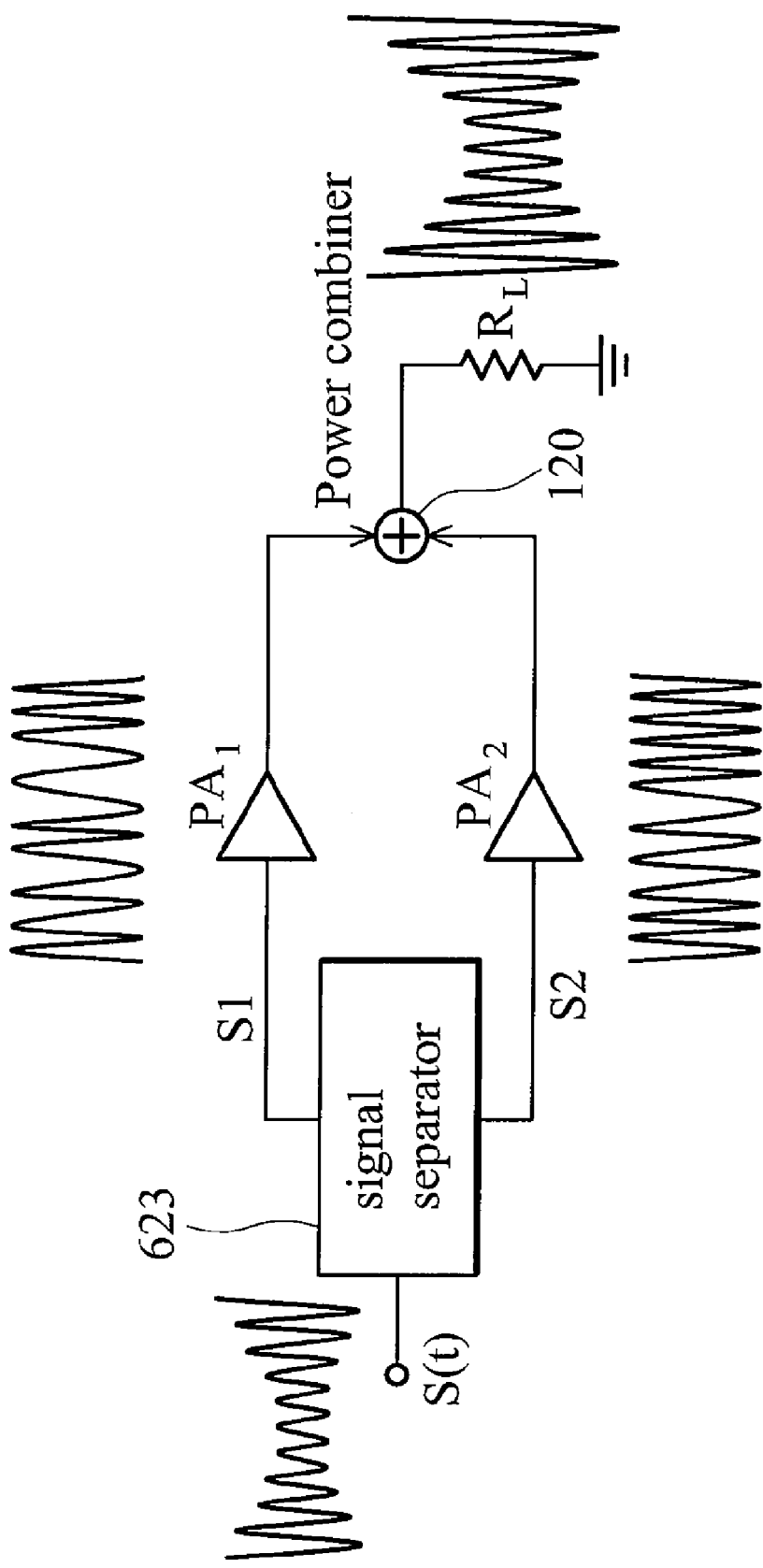
FIG. 1 is a block diagram of a conventional LINC architecture.
Figure 2A:
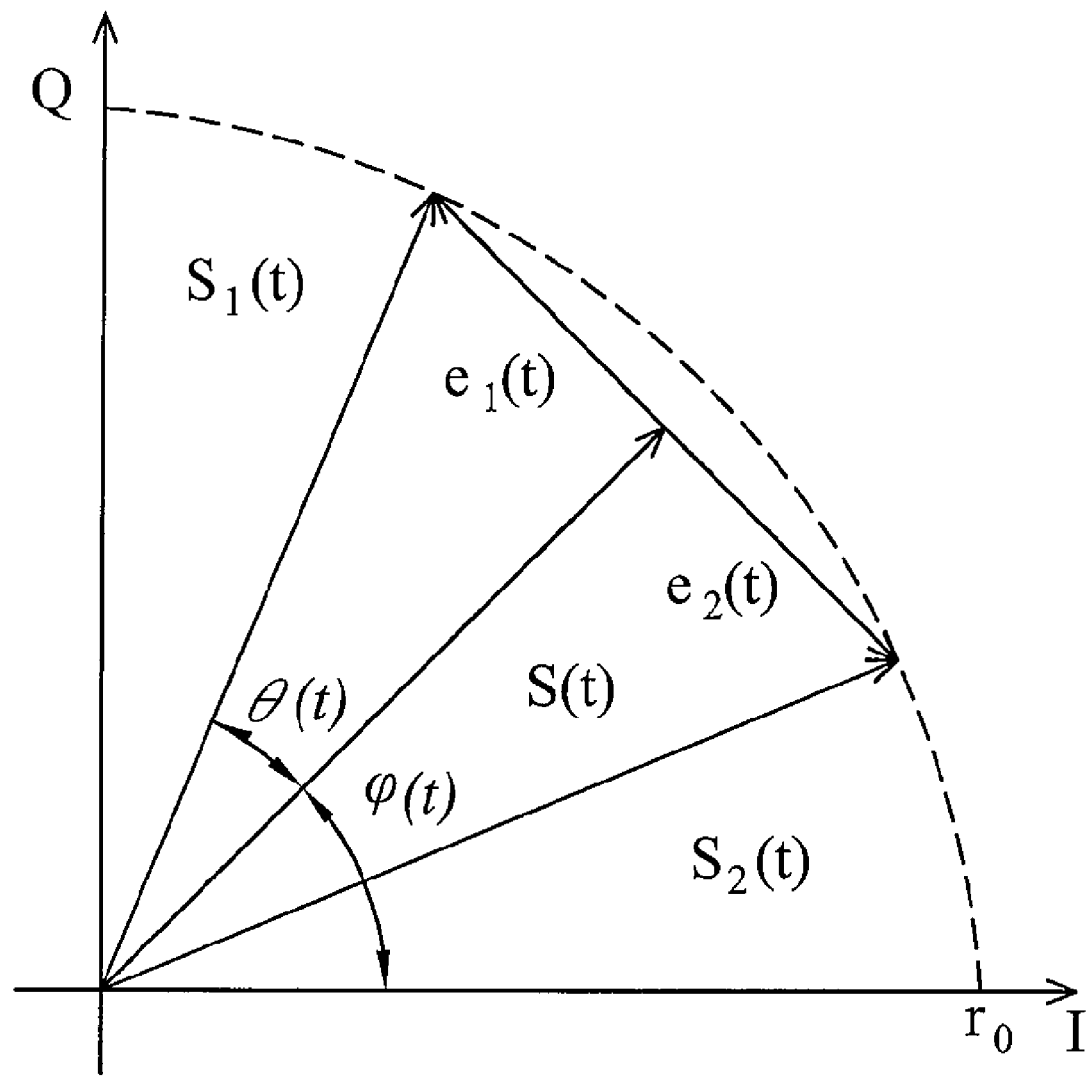
FIGS. 2A and 2B are respectively phasor diagrams of a signal and components thereof before and after amplification.
Figure 2B:
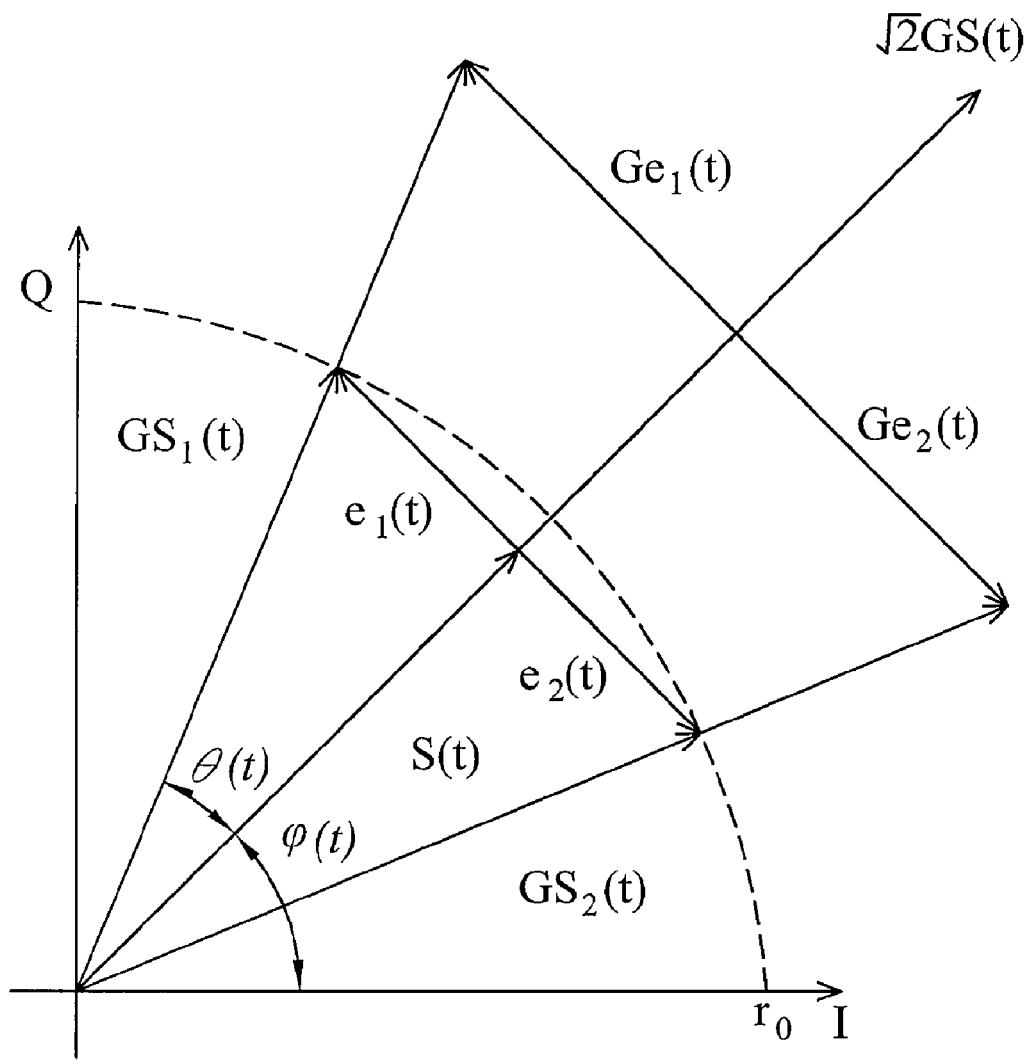
Figure 3:
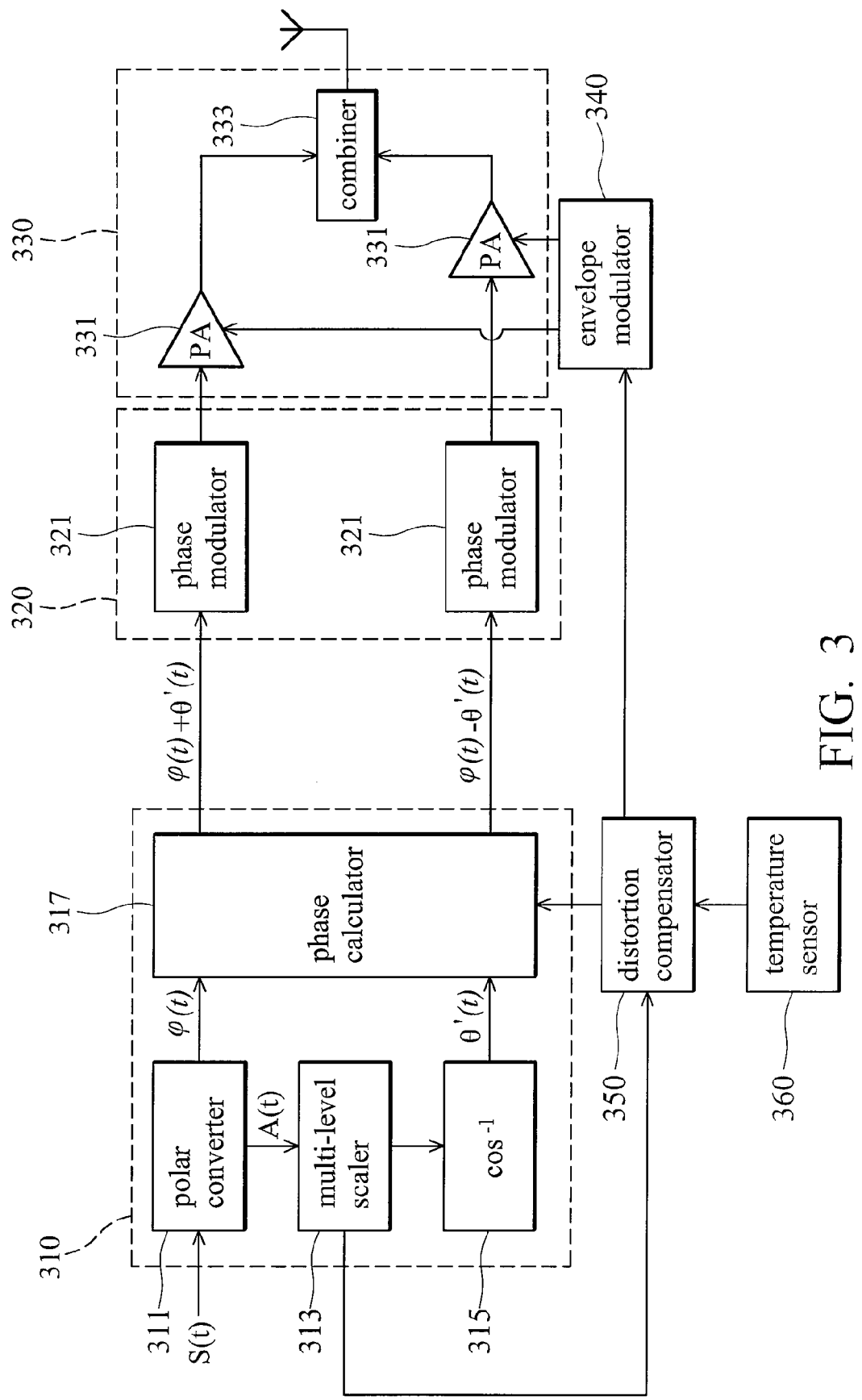
FIG. 3 is a block diagram of a multilevel LINC transmitter according to an embodiment of the invention.

FIG. 3 is a block diagram of a multilevel LINC transmitter according to an embodiment of the invention. The multilevel LINC transmitter 300 comprises a multilevel signal component separator 310, a phase modulator block 320, and an RF block 330. The multilevel signal component separator 310 comprises a polar converter 311, a multilevel scaler 313 coupled to the polar converter 311, an inverse cosine module 315 coupled to the multilevel scaler 313, and a phase calculator 317 coupled to the polar converter 311 and the inverse cosine module 315. The polar converter 311 receives and converts the input signal S(t) to polar form. Then, an envelope signal A(t) is scaled by a multilevel scaler 313 and the inverse cosine module 315 generates an out-phasing angle θ'(t). Thereafter, the phase calculator 317 generates phase signals φ(t)+θ'(t) and φ(t)−θ'(t). In other words, the multilevel signal component separator 310 converts the input signal S(t) into phase signals φ(t)+θ'(t) and φ(t)−θ'(t). The phase modulator block 320 comprises two phase modulators 321 coupled to the multilevel signal component separator 310. The RF block 330 comprises a plurality power amplifiers 331 coupled to the phase modulator block 320 and the multilevel scaler 313 and a power combiner 333 coupled to the power amplifiers 331.

In an embodiment of the invention, a Wilkinson power combiner is adopted in a LINC transmitter, however, scope of the invention is not limited thereto. Other hybrid couplers, lossless Wilkinson power combiner, Chireix-outphasing combiner, or the like are also applicable to the invention. For a Wilkinson power combiner, efficiency η(t) thereof is defined as, $$\eta(t) = \cos^2 \theta(t)$$

It is noted that η(t) is high when θ(t) is low. When the out-phasing angle θ(t) is substituted by the formula disclosed previously, the efficiency η(t) is expressed as, $$\theta(t) = \cos^{-1}\left(\frac{A(t)}{r_0}\right)$$

As a result, to utilize high power efficiency of a Wilkinson power combiner, the value of $r_0$ must be close to and not less than the maximum of A(t).

Figure 4A:
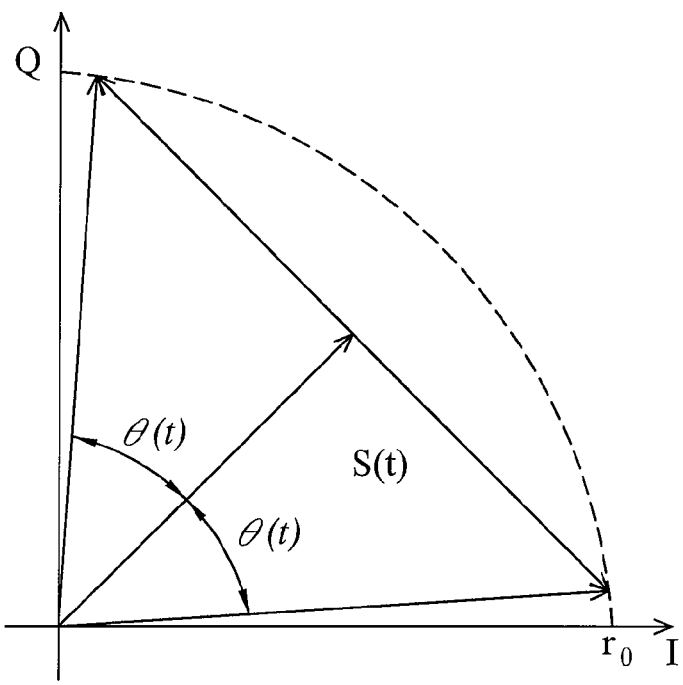
FIGS. 4A and 4B are respectively phasor diagrams showing out-phasing angles of single-level and multilevel scaling techniques.
Figure 4B:
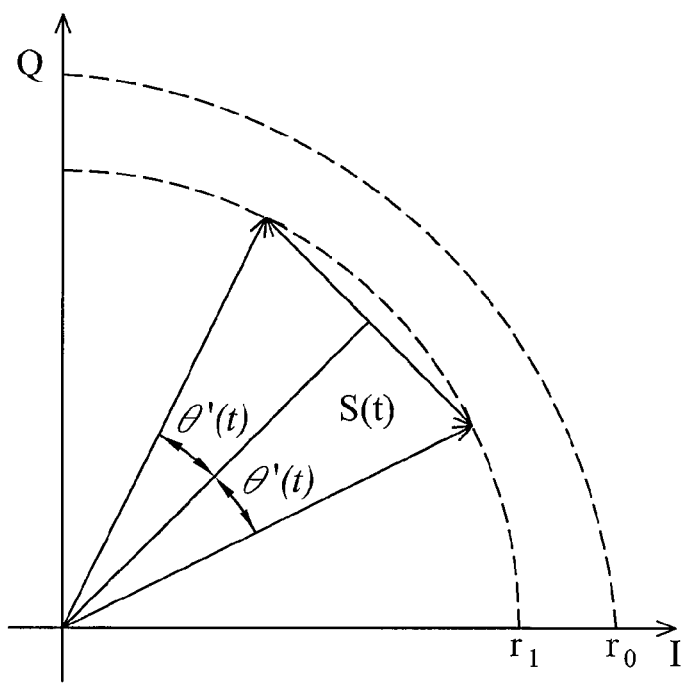
Figure 5A:
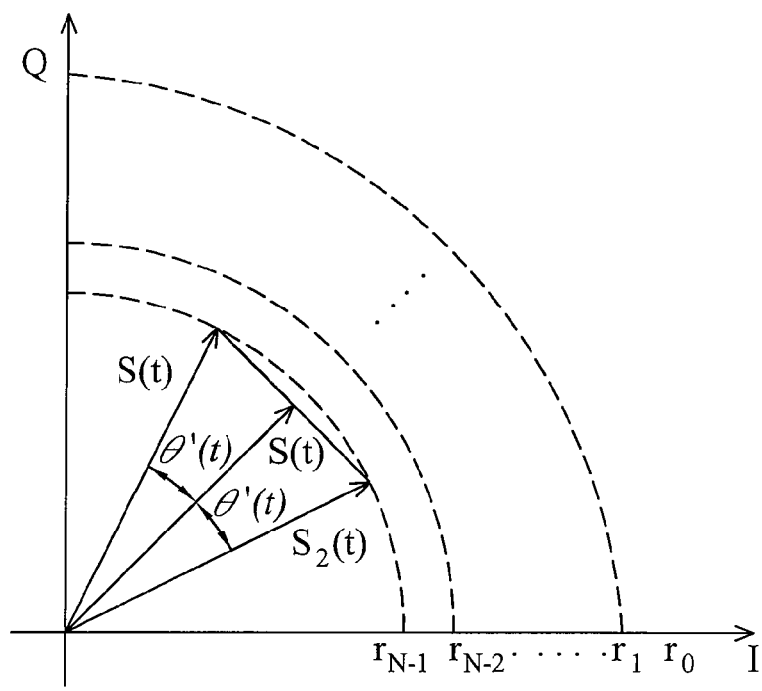
FIGS. 5A and 5B are respectively a detailed phasor diagram and a generalized phasor diagram showing out-phasing angles of multilevel scaling techniques.
Figure 5B:
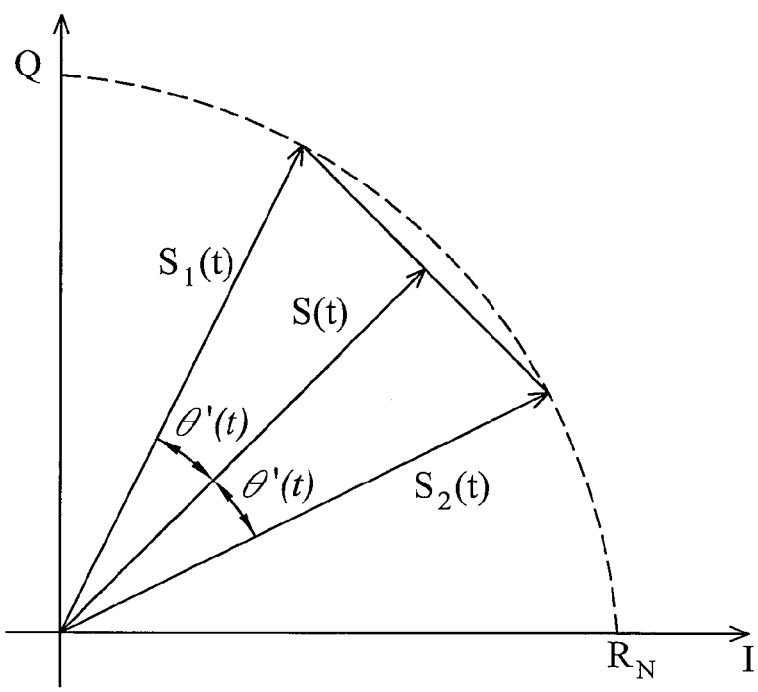

Rather than the conventional scaling technique using single-level $r_0$, the multilevel scaler 313 in FIG. 3 reduces θ(t) such that high Wilkinson power combiner efficiency is achieved. A 2-level design example is illustrated in FIG. 4B. When A(t) is much smaller than $r_0$, the multilevel scaler adapts scale factor from $r_0$ to $r_1$, and out-phasing angle. θ'(t) in FIG. 4B is much smaller than the conventional out-phasing angle θ(t) in FIG. 4A. Thus, the multilevel scaling technique enhances Wilkinson combiner efficiency. The multilevel scaling technique can be generalized to N levels in FIG. 5A, and $R_N$ is a general expression for multilevel scaling as shown in FIG. 5B, where $R_N = r_k$, for $r_{k+1} < A(t) \leq r_k$ k=0, 1, ..., N−1, where $r_N = 0$, $r_0 = \max(A(t))$. The definition of out-phasing angle θ'(t) in multilevel scaling technique is modified as $$\theta'(t) = \cos^{-1}\left(\frac{A(t)}{R_N}\right).$$

To maximize the Wilkinson power combiner efficiency, optimal scale factors of each level $r_k$ need to be determined in advance. Since multilevel scale factors are used in the LINC transmitter, Wilkinson power combiner efficiency formula is modified as $$\eta(t) = \left(\frac{A(t)}{R_N}\right)^2.$$

Figure 6:
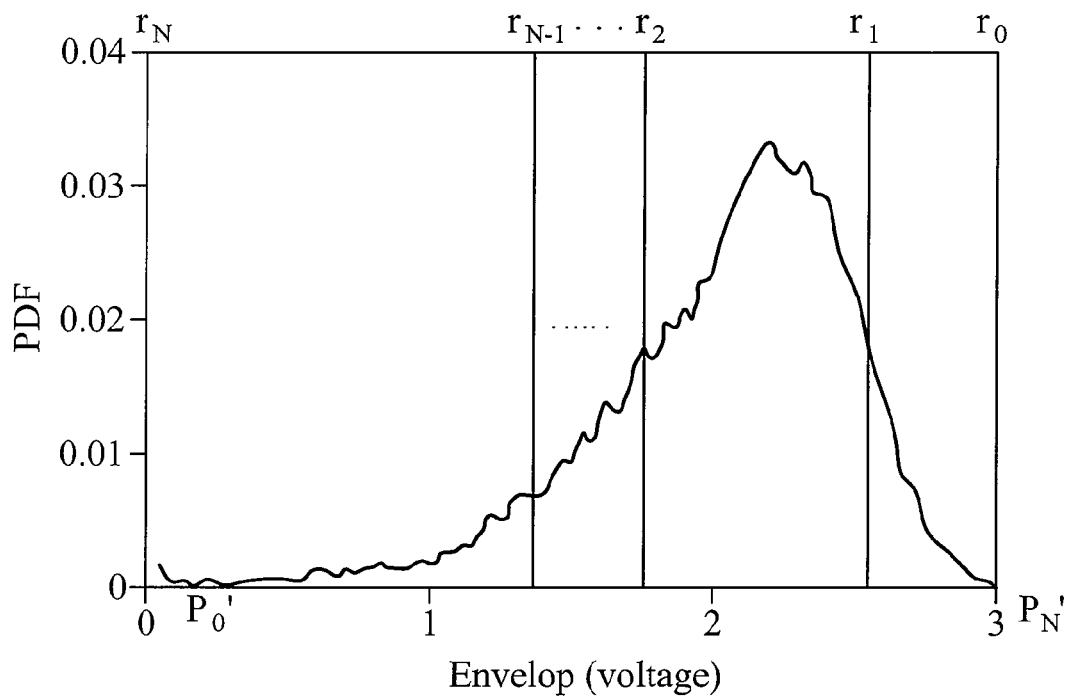
FIG. 6 is a schematic diagram showing signal envelope distribution in WCDMA.

FIG. 6 shows envelope distribution of WCDMA where A(t) is a probability function. To acquire an expected value of η(t), the envelope A(t) is divided into several regions, illustrated in FIG. 5. Then, the expectation value of each region is summed to derive E(η)(t)), $$E(\eta(t)) = \sum_{k=0}^{k=N-1} \int_{r_k}^{r_{k+1}} p(A(t)) \cdot \left(\frac{A(t)}{r_k}\right)^2 dA(t),$$

wherein p(A(t)) is a probability density function of A(t), $r_k$ is a value of a kth level scale factor, N is a number of a scale factor level, and max(A(t)) is a maximum input signal envelope. To maximize the Wilkinson power combiner efficiency, E(η(t)) is differentiated such that $$\frac{\partial E(\eta(t))}{\partial P'_k(t)} = 0,$$

whrerein k=0, 1, ..., N. As a result, an optimal set of $R_N$ is obtained. With the optimal set of $R_N$, the multilevel scaler dynamically adapts $R_N$ close to and no lower than the envelope A(t).

Figure 7:
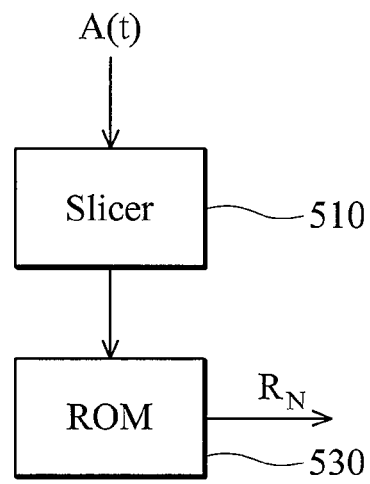
FIG. 7 is a block diagram of a multilevel scaler 313 in FIG. 3.

FIG. 7 is a block diagram of a multilevel scaler 313 in FIG. 3. The multilevel scaler 313 comprises a slicer 510 and a ROM 530 coupled to the slicer 510. The slicer 510 is used to select and output a specific $r_k$ to the inverse cosine module 315. Preferably, the slicer 510 comprises a comparator. The comparator determines in which range the envelope A(t) is and which $r_k$ should be selected according thereto. The ROM 530 stores the optimal set of $R_N$.

Figure 8:
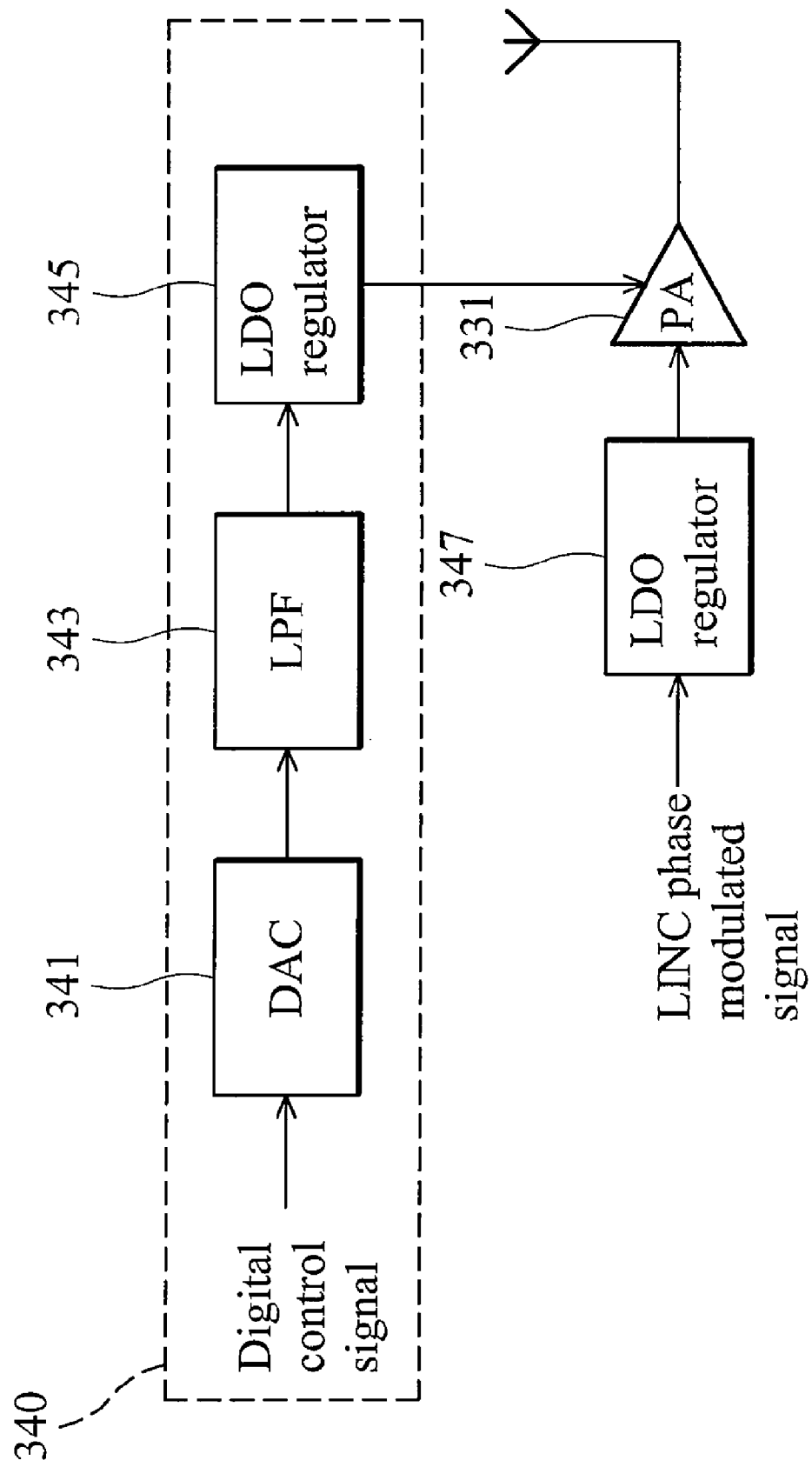
FIG. 8 is a block diagram of the envelope modulator 340 in FIG. 3.

Moreover, the multilevel LINC transmitter according to an embodiment of the invention further comprises an envelope modulator 340 coupled to the multilevel scaler 313 and the power amplifiers 331, as shown in FIG. 3. FIG. 8 is a block diagram of the envelope modulator 340 in FIG. 3. The envelope modulator 340 comprises a digital to analog converter (DAC) 341 coupled to the multilevel scaler 313, a low pass filter (LPF) 343 coupled between the DAC 341, and a low low drop-out (LDO) regulator 345 coupled between the LPF 343 and the power amplifier 331. An input signal of the envelope modulator 340 is a digital control signal from the multilevel scaler 313. The digital-to-analog converter (DAC) 341 converts the control signal to an analog signal. Then the analog control signal passes through the low pass filter (LPF) 343. Finally, the highly power efficient low drop out (LDO) regulator 345 ensures a robust power supply voltage to the PA 331. Due to RC delay, the control signal path group delay and the phase path delay are different. An additional delay compensator is inserted in a phase path, between the phase modulator block and the RF block, to partially overcome distortion due to RC delay.

Figure 9A:
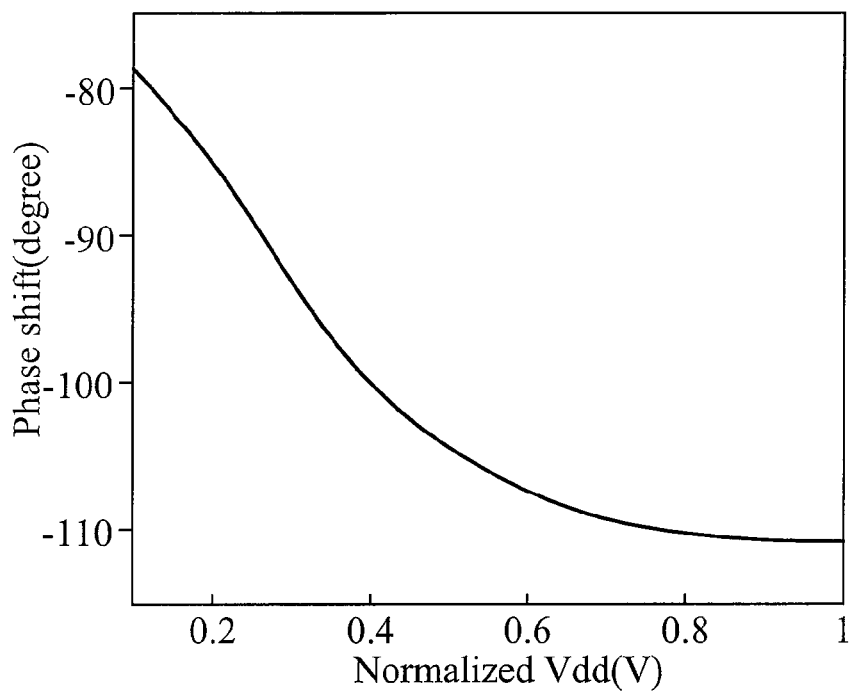
FIG. 9A is a schematic diagram of VDD-to-PM distortion which degrades linearity.
Figure 9B:
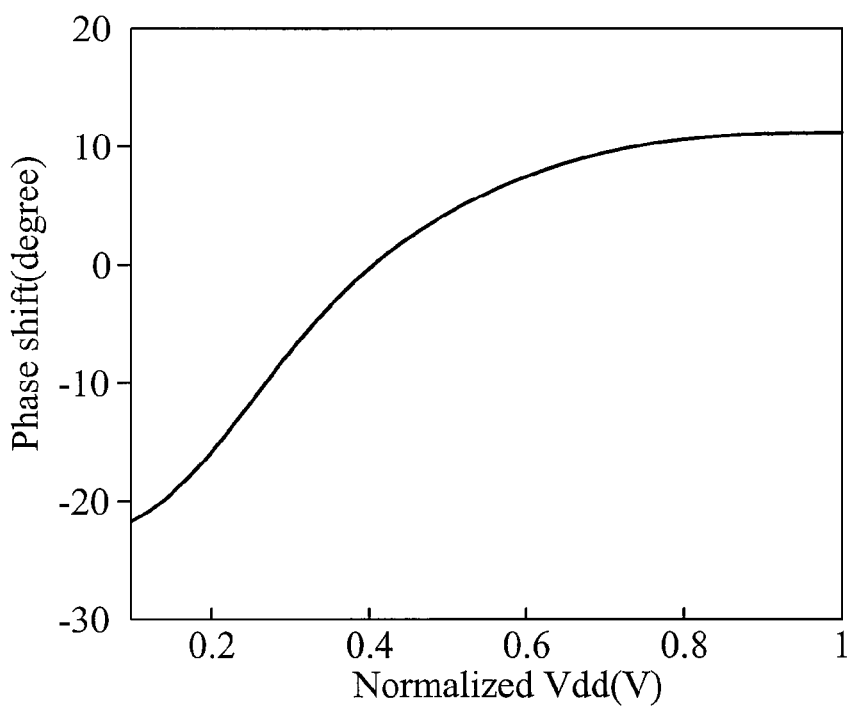
FIG. 9B is a schematic diagram showing characteristics of the distortion compensator 350 in FIG. 3.
Figure 9C:
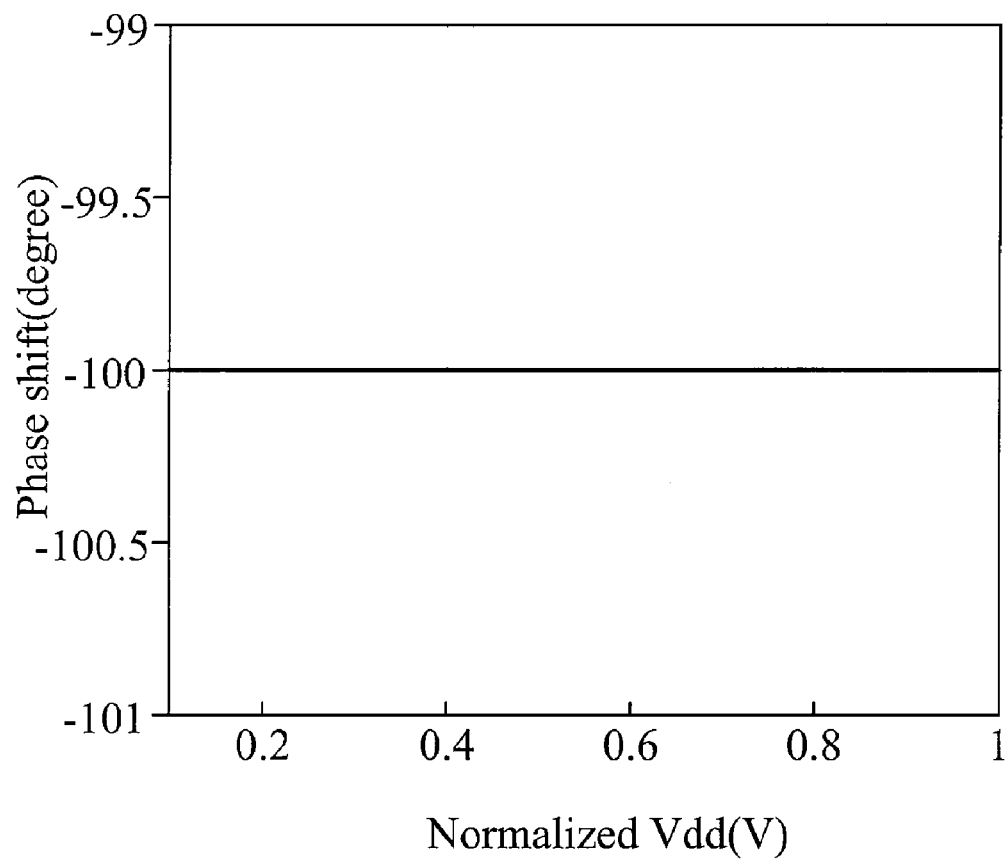
FIG. 9C is a schematic diagram showing constant phase of the output signal of the multilevel LINC transmitter with different PA supply votlages.

Additionally, the multilevel LINC transmitter according to an embodiment of the invention further comprises a distortion compensator 350 coupled between the multilevel signal component separator 310 and the envelope modulator 340. Since adjustment of the supply voltage of two RF power amplifiers 331 introduces another distortion, VDD-to-PM distortion, a distortion compensator 350 is incorporated in the multilevel LINC transmitter to compensate VDD-to-PM distortion. FIG. 9A is a schematic diagram of VDD-to-PM distortion which degrades linearity. To correct VDD-to-PM distortion, a digital distortion compensator 350 with characteristics shown in FIG. 9B is incorporated in the multilevel LINC transmitter. Thus, phase of the output signal remains constant even with different PA supply voltages, as shown in FIG. 9C.

Moreover, the multilevel LINC transmitter according to an embodiment of the invention further comprises a temperature sensor 360. Since temperature variation may result in different VDD-to-PM distortion, a temperature sensor 360 is incorporated in the the multilevel LINC transmitter such that VDD-to-PM distortion is compensated.

The invention provides a multilevel LINC transmitter with a multilevel scaler in a multilevel signal component separator thereof. The multilevel scaler dynamically adapts a scale factor according to the input signal and therefore the outphasing angle is adjustable. As a result, high power efficiency and linearity are achieved.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A multilevel LINC transmitter, comprising:
   a multilevel signal component separator comprising a multilevel scaler and converting an input signal to phase signals;
   a phase modulator block coupled to the multilevel signal component separator; and
   an RF block comprising a plurality of power amplifiers coupled to the phase modulator block and the multilevel scaler and a power combiner coupled to the power amplifiers.

2. The multilevel LINC transmitter as claimed in claim 1, wherein the multilevel scaler comprises an slicer and a ROM coupled to the slicer.

3. The multilevel LINC transmitter as claimed in claim 2, wherein the slicer comprises a comparator.

4. The multilevel LINC transmitter as claimed in claim 1, further comprising an envelope modulator coupled to the multilevel scaler and the power amplifiers.

5. The multilevel LINC transmitter as claimed in claim 4, wherein the envelope modulator comprises a digital to analog converter (DAC) coupled to the multilevel scaler and a low pass filter (LPF) coupled between the DAC and the power amplifiers.

6. The multilevel LINC transmitter as claimed in claim 5, wherein the envelope modulator further comprises a low drop-out (LDO) regulator coupled between the LPF and the power amplifier.

7. The multilevel LINC transmitter as claimed in claim 6, further comprising a delay compensator coupled between the phase modulator block and the RF block.

8. The multilevel LINC transmitter as claimed in claim 4, further comprising a distortion compensator coupled between the multilevel signal component separator and the envelope modulator.

9. The multilevel LINC transmitter as claimed in claim 8, further comprising a sensor coupled to the distortion compensator.

10. The multilevel LINC transmitter as claimed in claim 1, wherein the power combiner is a Wilkinson combiner.

* * * * *